(12) United States Patent
Wang et al.

(10) Patent No.: US 9,989,595 B1
(45) Date of Patent: Jun. 5, 2018

(54) METHODS FOR ON-LINE, HIGH-ACCURACY ESTIMATION OF BATTERY STATE OF POWER

(71) Applicant: HRL Laboratories, LLC, Malibu, CA (US)

(72) Inventors: Shuoqin Wang, Westlake Village, CA (US); Luan D. Vu, Midway City, CA (US); Qin Jiang, Park Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 644 days.

(21) Appl. No.: 14/586,828

(22) Filed: Dec. 30, 2014

Related U.S. Application Data

(60) Provisional application No. 61/922,278, filed on Dec. 31, 2013.

(51) Int. Cl.
*G01R 31/36* (2006.01)

(52) U.S. Cl.
CPC ..... *G01R 31/3648* (2013.01); *G01R 31/3606* (2013.01)

(58) Field of Classification Search
CPC .................................................. G01R 31/3648
USPC .............................................................. 702/63
See application file for complete search history.

(56) References Cited

U.S. PATENT DOCUMENTS

| | | | |
|---|---|---|---|
| 5,381,096 A * | 1/1995 | Hirzel | G01R 31/3651 320/DIG. 21 |
| 5,633,801 A | 5/1997 | Bottman | |
| 6,339,334 B1 | 1/2002 | Park | |
| 6,441,586 B1 * | 8/2002 | Tate, Jr. | G01R 31/3648 320/132 |
| 7,015,701 B2 | 3/2006 | Wiegand | |

(Continued)

FOREIGN PATENT DOCUMENTS

KR 20130046946 A 5/2013

OTHER PUBLICATIONS

Xiao et al., "A universal state-of-charge algorithm for batteries," 47th IEEE Design Automation Conference, Anaheim, CA, 2010.

(Continued)

*Primary Examiner* — Ricky Ngon
(74) *Attorney, Agent, or Firm* — O'Connor & Company

(57) ABSTRACT

Some variations provide a method for real-time estimation of state of charge and state of power of a battery, comprising: (a) cycling a battery with a driving profile; (b) utilizing a recursive algorithm that relates battery terminal voltage to battery current, wherein the algorithm includes open-circuit voltage and a finite-impulse-response filter to dynamically model kinetic voltage; measuring the battery terminal voltage and the battery current at least at a first time and a second time during cycling; calculating battery open-circuit voltage and finite-impulse-response filter parameters; calculating battery state of charge based on the open-circuit voltage; and calculating battery state of power based on the open-circuit voltage and the finite-impulse-response filter parameters. An extended Kalman filtering technique is incorporated for real-time updating of FIR model parameters. Only a single FIR filter is necessary, making these methods applicable for battery-powered systems with limited computing and storage capabilities.

20 Claims, 13 Drawing Sheets

(56) References Cited

U.S. PATENT DOCUMENTS

| | | | |
|---|---|---|---|
| 7,504,835 | B2 | 3/2009 | Byington et al. |
| 7,983,863 | B2 | 7/2011 | Jin et al. |
| 8,084,996 | B2 | 12/2011 | Zhang et al. |
| 8,116,998 | B2 | 2/2012 | Hess et al. |
| 2011/0060538 | A1* | 3/2011 | Fahimi ............... G01R 31/3679 702/63 |
| 2013/0043876 | A1 | 2/2013 | Liu et al. |
| 2015/0147614 | A1 | 5/2015 | Wang et al. |

OTHER PUBLICATIONS

Wang et al., "Multi-parameter battery state estimator based on the adaptive and direct solution of the governing differential equations" Journal of Power Sources 196 (2011) 8735-8741.

Kiani, "Online Detection of Faulty Battery Cells in Energy Storage Systems Via Impulse Response Method" 978-1-61284-247-9/11 2011 IEEE.

Einhorn et al., "A method for online capacity estimation of lithium ion battery cells using the state of charge and the transferred charge," IEEE Transactions on Industry Applications, vol. 48, No. 2, Mar./Apr. 2012.

Weng et al., Abstract, "On-board state of health monitoring of lithium-ion batteries using incremental capacity analysis with support vector regression," Journal of Power Sources, vol. 235, Aug. 1, 2013, pp. 36-44; Abstract.

Buller et al., "Impedance-Based Simulation Models of Supercapacitors and Li-Ion Batteries for Power Electronic Applications," IEEE Transactions on Industry Applications, vol. 41, No. 3, May/Jun. 2005.

Xiong et al., "Online Estimation of Peak Power Capability of Li-Ion Batteries in Electric Vehicles by a Hardware-in-Loop Approach," Energies 2012, 5, 1455-1469; doi:10.3390/en5051455.

Wang et al., "Power prediction from a battery state estimator that incorporates diffusion resistance," Journal of Power Sources 214 (2012) 399-406.

Wang et al., "Battery State Estimator Based on a Finite Impulse Response Filter," J. Electrochemical Society, 160 (11), A1962-A1970 (2013).

* cited by examiner

METHODS FOR ON-LINE, HIGH-ACCURACY ESTIMATION OF BATTERY STATE OF POWER

PRIORITY DATA

This non-provisional patent application claims priority to U.S. Provisional Patent Application No. 61/922,278, filed Dec. 31, 2013, which is hereby incorporated by reference herein in its entirety.

FIELD OF THE INVENTION

The present invention generally relates to the real-time characterization of electrochemical systems, such as batteries and fuel cells.

BACKGROUND OF THE INVENTION

An electrochemical system either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. On-line characterization of batteries or fuel cells in vehicles is difficult, due to very rough noisy environments.

In many battery-powered systems such as electric vehicles, laptops, and smartphones, accurate estimation of the battery state of power (SOP) is necessary to maximize system power throughput as well as to protect the battery from overcharging or discharging. It is challenging to predict the SOP, because the battery behavior is nonlinear when it is operated at its peak power. Traditional methods, such as hybrid pulse power characterization, have been used in the lab for SOP prediction but are generally not applicable for on-line applications due to the requirement for specific driving profiles.

Recently, a finite impulse response (FIR) filtering approach has been demonstrated to have great potential to estimate state of charge (SOC), as described in U.S. patent application Ser. No. 13/751,089, filed Jan. 27, 2013, entitled "METHODS AND APPARATUS FOR DYNAMIC ESTIMATION OF BATTERY OPEN-CIRCUIT VOLTAGE," as well as U.S. patent application Ser. No. 13/646,663, filed Oct. 6, 2012, entitled "METHODS AND APPARATUS FOR DYNAMIC CHARACTERIZATION OF ELECTROCHEMICAL SYSTEMS" both of which are incorporated by reference herein as though fully set forth.

There remains a need for FIR-based methods that can predict battery SOP as well as SOC accurately in real time. In many applications of battery-powered systems such as electric vehicles, laptops, and smartphones, it is desirable to project battery power capabilities continuously, based on the present (evolving) battery conditions. These battery conditions include external environments such as temperatures and pressures, and internal conditions such as its age, its present state of charge and kinetics, etc.

A goal of SOP estimation is to calculate battery charge and discharge power capabilities, based on which a battery power management system can maximize the battery power efficiency without overcharge/discharge. Many recent commercial battery-powered systems do not include SOP estimators. In these products, battery charge/discharge currents and voltages are bounded by specific values which were predetermined by manufacturers. These current and voltage boundaries are predetermined to protect the battery from overcharge/discharge battery.

However, there are obvious drawbacks with these static limits. First of all, these limits don't reflect battery aging. Those boundaries for safe operation may need to be updated since they are may not be safe as a battery becomes old. Secondly, these limits tend to be conservative during the beginning life of battery because they were determined to accommodate many non-predictable factors. Yet for healthy batteries, it is safe to operate beyond these predetermined limits in most cases. Therefore a continuing need exists to regulate battery power outputs through dynamic, real-time adjustment of operational boundaries.

SUMMARY OF THE INVENTION

The present invention addresses the aforementioned needs in the art, as will now be summarized and then further described in detail below.

Some variations of the invention provide a method for real-time estimation of state of charge and state of power of a battery, the method comprising:

(a) cycling a battery with a driving profile;

(b) initializing a recursive algorithm that relates battery terminal voltage to battery current, wherein the recursive algorithm includes voltage components of (i) open-circuit voltage and (ii) a finite-impulse-response filter to dynamically model kinetic voltage;

(c) measuring the battery terminal voltage and the battery current at least at a first time and a second time during the cycling;

(d) calculating, using the recursive algorithm, battery open-circuit voltage and finite-impulse-response filter parameters;

(e) calculating battery state of charge based on the open-circuit voltage from step (d), using a look-up table, graph, equation, or combination thereof; and (f) calculating battery state of power based on the open-circuit voltage and the finite-impulse-response filter parameters from step (d).

In some embodiments, the battery is a metal-ion battery, such as a lithium-ion battery. The driving profile may be arbitrary (i.e., non-specified or random) or specified. For example, in certain embodiments, the driving profile includes a plurality of double-pulse sequences, wherein each of the double-pulse sequences comprises a discharge pulse having a pulse width and a pulse amplitude, a charge pulse having the pulse width and the pulse amplitude, and a zero-current period. Cycling in step (a) is performed for at least 1 minute, in some embodiments.

The initializing in step (b) may use the battery terminal voltage measured at the beginning of the cycling. The kinetic voltage may be formulated as the convolution of the finite-impulse-response filter parameters with the battery current.

In some embodiments, the finite-impulse-response filter is the only filter in the recursive algorithm. The recursive algorithm may utilize an extended Kalman filter. Optionally, the method includes adjusting the number of the finite-impulse-response filter parameters to improve stability of the method or to accommodate battery kinetics.

In some embodiments, the method further comprises generating a look-up table, graph, equation, or combination thereof to form a pre-determined correlation of the open-circuit voltage with the battery state of charge.

The state of power may be calculated as a product of a time-varying voltage and a constant current. The constant current may be the maximum positive (charging) or negative (discharging) current applicable to the battery.

In these or other embodiments, the state of power is calculated as a product of a constant voltage and a time-varying current. The constant voltage may be the maximum voltage (charging) or minimum voltage (discharging) current applicable to the battery.

Other variations of this invention provide a system for dynamically characterizing the state of charge and state of power a battery (e.g., a lithium-ion battery), the system comprising a battery and a programmable power-supply apparatus electrically linked with the battery, wherein the programmable power-supply apparatus is programmed using non-transitory memory with executable code for executing the steps of:

(a) cycling a battery with a driving profile;
(b) initializing a recursive algorithm that relates battery terminal voltage to battery current, wherein the recursive algorithm includes voltage components of (i) open-circuit voltage and (ii) a finite-impulse-response filter to dynamically model kinetic voltage;
(c) measuring the battery terminal voltage and the battery current at least at a first time and a second time during the cycling;
(d) calculating, using the recursive algorithm, battery open-circuit voltage and finite-impulse-response filter parameters;
(e) calculating battery state of charge based on the open-circuit voltage from step (d), using a look-up table, graph, equation, or combination thereof; and
(f) calculating battery state of power based on the open-circuit voltage and the finite-impulse-response filter parameters from step (d).

In certain system embodiments, the driving profile includes a plurality of double-pulse sequences, wherein each of the double-pulse sequences comprises a discharge pulse having a pulse width and a pulse amplitude, a charge pulse having the pulse width and the pulse amplitude, and a zero-current period.

The kinetic voltage may be formulated as the convolution of the finite-impulse-response filter parameters with the battery current.

The finite-impulse-response filter is the only filter in the recursive algorithm, in some system embodiments. The recursive algorithm may utilize an extended Kalman filter, for example.

In some embodiments, the state of power is calculated as a product of a time-varying voltage and a constant current, wherein the constant current is the maximum positive (charging) or negative (discharging) current applicable to the battery. Alternatively, or additionally, the state of power is calculated as a product of a constant voltage and a time-varying current, wherein the constant voltage is the maximum voltage (charging) or minimum voltage (discharging) current applicable to the battery.

The present invention, in some variations, also provides a computer-readable medium containing program instructions for characterizing the state of charge and state of power of a battery, wherein execution of the program instructions by one or more processors of a computer causes the one or more processors to carry out the steps of:

(a) cycling a battery with a driving profile;
(b) initializing a recursive algorithm that relates battery terminal voltage to battery current, wherein the recursive algorithm includes voltage components of (i) open-circuit voltage and (ii) a finite-impulse-response filter to dynamically model kinetic voltage;
(c) measuring the battery terminal voltage and the battery current at least at a first time and a second time during the cycling;
(d) calculating, using the recursive algorithm, battery open-circuit voltage and finite-impulse-response filter parameters;
(e) optionally adjusting the number of the finite-impulse-response filter parameters to improve stability of the method or to accommodate battery kinetics;
(f) calculating battery state of charge based on the open-circuit voltage from step (d), using a look-up table, graph, equation, or combination thereof; and
(g) calculating battery state of power based on the open-circuit voltage and the finite-impulse-response filter parameters from step (d).

DETAILED DESCRIPTION OF EMBODIMENTS OF THE INVENTION

Figure 1:
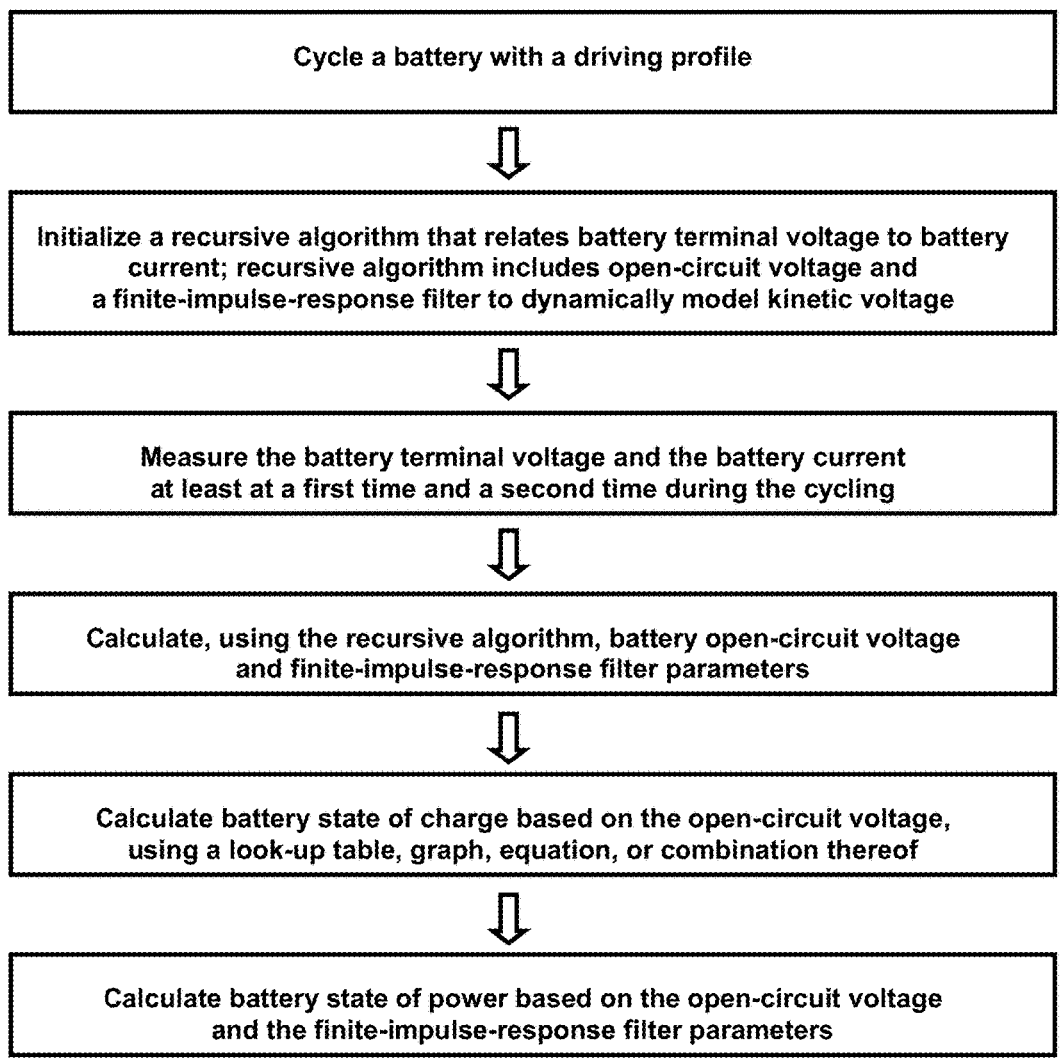
FIG. 1 is a flowchart depicting some methods of the invention.

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs. As intended herein, "receiving" shall be broadly construed as including "providing," "obtaining," "sensing" (e.g., using a sensor attached to a computer), "calculating" (e.g., using executable code in a computer), and so on.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific methods and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of".

Generally speaking, any system having an anode and a cathode; any system that supplies, receives, or is in electrical communication with a current and a voltage source or signal; or any system capable of being characterized utilizing the principles described herein, may be an "electrochemical system" within the intended meaning. Electrochemical systems that may be characterized using these impulse-response-based methods include, but are by no means limited to, batteries, electrolytic cells, fuel cells, capacitors, supercapacitors, ultracapacitors, hybrid combustion-electric systems, and other energy-delivery or energy-storage devices.

When the electrochemical system is a battery, the impulse-response-based method enables one to accurately estimate the battery states under dynamic operating conditions. Battery states include, but are not limited to, state-of-health, state-of-charge, state-of-power, high-frequency resistance, charge-transfer resistance, and double-layer capacitance. State-of-health is a figure of merit of the condition of a battery (or a cell, or a battery pack), compared to its ideal conditions. State-of-charge (SOC) is an indication of how much useful energy remains in the battery. State-of-power characterizes the charge and discharge power capabilities of the battery. High-frequency resistance, charge-transfer resistance, and double-layer capacitance characterize the actual kinetic processes that take place in the battery, including both electrochemical reactions as well as mass transport and diffusion processes.

Some variations of this invention utilize an impulse-response-based method for on-line characterization of an electrochemical system. A method as provided herein may utilize measured current (I) and/or voltage (V) signals to directly extract thermodynamic and kinetic information associated with the electrochemical system, dynamically (in real time). The impulse-response-based methods of the present invention can provide high-speed characterization of an electrochemical system with improved accuracy.

The methods work in the time domain without relying on frequency-domain transformations. Therefore, these methods are more aligned for real-time applications. In addition, the disclosed impulse-response-based methods provide broader capabilities in characterizing an electrochemical system by prescribing an impulse-response function. Circuit models employing conventional circuit elements can have difficulty describing some kinetic processes. In particular, the methods herein explicitly account for time-domain diffusion phenomena.

Some variations of this invention provide a finite-impulse response (FIR)-based method that can predict battery state of power (SOP) and state of charge (SOC) accurately and in real time. An extended Kalman filtering technique is incorporated, in some embodiments, for real-time updating of FIR model parameters. In some embodiments, only a single FIR filter is necessary to estimate both SOP and SOC at the same time, making these methods applicable for battery-powered systems with limited computing and storage (memory) capabilities.

In this disclosure, "real time" is intended to mean that characterization (including monitoring and updating) has a time scale of about 1 millisecond ($10^{-3}$ s) or less. Any event happening within about 1 millisecond is considered as happening at the same time, with respect to battery monitoring. Therefore, battery characterization within about 1 millisecond is considered real-time (or delay-free) characterization. The actual time scale of characterization may on the order of $10^{-4}$ s, $10^{-5}$ s, $10^{-6}$ s, or even shorter times, in some embodiments.

Variations of the invention provide a model-based technique that can predict the power capabilities of a battery-powered system in real-time. The SOP prediction allows for maximizing the system power throughput as well as for protecting the battery from overcharging/discharging. In some embodiments, the accuracy of SOP prediction is enhanced by at least 10-20% compared to the prior art. Also, the computing and storage requirements according to some embodiments are at least two times less than previous methods. Therefore, the disclosed methods may be implemented in battery-powered systems such as electric vehicles and aircraft, without compromising the accuracy and capability of real-time predictions.

Some embodiments utilize one or more FIR filters as described in Wang et al., "Battery State Estimator Based on a Finite Impulse Response Filter, J. Electrochem. Soc. 2013, 160(11): A1962-A1970, which is hereby incorporated by reference herein. Wang et al. introduces FIR filters for battery state estimation, using a linear recursive algorithm, with two digital filters embedded in the algorithm in order to predict SOC and SOP. As set forth herein, in contrast to a linear recursive algorithm, a non-linear recursive algorithm can more accurately address the non-linear relationship between open circuit voltage and SOC. Furthermore, in some embodiments of the present invention, only one digital filter is employed to predict both SOP and SOC.

There are two quantitative evaluations of power capabilities of a battery. One quantification of the SOP is the constant-current power capability SOP', which is defined as $$SOP_I(t) = I_{max} V(t) \qquad \text{EQ. 1}$$

where $I_{max}$ is the maximum discharge, or charge, current values allowed by the traction system (e.g., fuses) and V(t) is the battery voltage response after the onset of the constant-current demand.

Another quantification of the SOP is the constant-voltage power capability $SOP_V$, defined as $$SOP_V(t) = V_{limit} I(t) \qquad \text{EQ. 2}$$

where $V_{limit}$ represents the maximum (charge) or minimum (discharge) value allowed by the traction system; and I(t) is the battery terminal current output after the onset of the constant voltage. Either $SOP_I$ or $SOP_V$ can be chosen by a battery management system to predict battery power capability or to ensure the battery is working within limits.

Embodiments according to the principles of the present invention can predict SOC, $SOP_I$ and $SOP_V$ simultaneously with only one FIR (finite impulse response) filter. Embodiments according to the principles of the present invention employ an extended Kalman-filtering technique that can recursively regress parameters of the FIR filter in real time, from which the above-mentioned battery states are calculated.

Some variations of the invention provide a method (such as depicted in the flowchart of FIG. 1) for real-time estimation of state of charge and state of power of a battery, the method comprising:

(a) cycling a battery with a driving profile;

(b) initializing a recursive algorithm that relates battery terminal voltage to battery current, wherein the recursive algorithm includes voltage components of (i) open-circuit voltage and (ii) a finite-impulse-response filter to dynamically model kinetic voltage;

(c) measuring the battery terminal voltage and the battery current at least at a first time and a second time during the cycling;

(d) calculating, using the recursive algorithm, battery open-circuit voltage and finite-impulse-response filter parameters;

(e) calculating battery state of charge based on the open-circuit voltage from step (d), using a look-up table, graph, equation, or combination thereof; and (f) calculating battery state of power based on the open-circuit voltage and the finite-impulse-response filter parameters from step (d).

In some embodiments, the battery is a metal-ion battery, such as a lithium-ion battery. The driving profile may be arbitrary (i.e., non-specified or random) or specified. For example, in certain embodiments, the driving profile includes a plurality of double-pulse sequences, wherein each of the double-pulse sequences comprises a discharge pulse having a pulse width and a pulse amplitude, a charge pulse having the pulse width and the pulse amplitude, and a zero-current period. Cycling in step (a) is performed for at least 1 minute, in some embodiments.

The initializing in step (b) may use the battery terminal voltage measured at the beginning of the cycling. The kinetic voltage may be formulated as the convolution of the finite-impulse-response filter parameters with the battery current.

In some embodiments, the finite-impulse-response filter is the only filter in the recursive algorithm. The recursive algorithm may utilize an extended Kalman filter. Optionally, the method includes adjusting the number of the finite-impulse-response filter parameters to improve stability of the method or to accommodate battery kinetics.

In some embodiments, the method comprises generating a look-up table, graph, equation, or combination thereof to form a pre-determined correlation of the open-circuit voltage with the battery state of charge.

The terminal current values may be measured current values before the onset of the power test. The terminal voltage values may be measured terminal values before the onset of the power test. In some embodiments, the voltage is the terminal voltage subtracted by the $V_{oc}$ and by the convolution between FIR parameters and corresponding terminal current values. Current may be calculated as a voltage divided by the first element of FIR parameters.

The state of power may be calculated as a product of a time-varying voltage and a constant current. The constant current may be the maximum positive (charging) or negative (discharging) current applicable to the battery.

In these or other embodiments, the state of power is calculated as a product of a constant voltage and a time-varying current. The constant voltage may be the maximum voltage (charging) or minimum voltage (discharging) current applicable to the battery.

Figure 2:
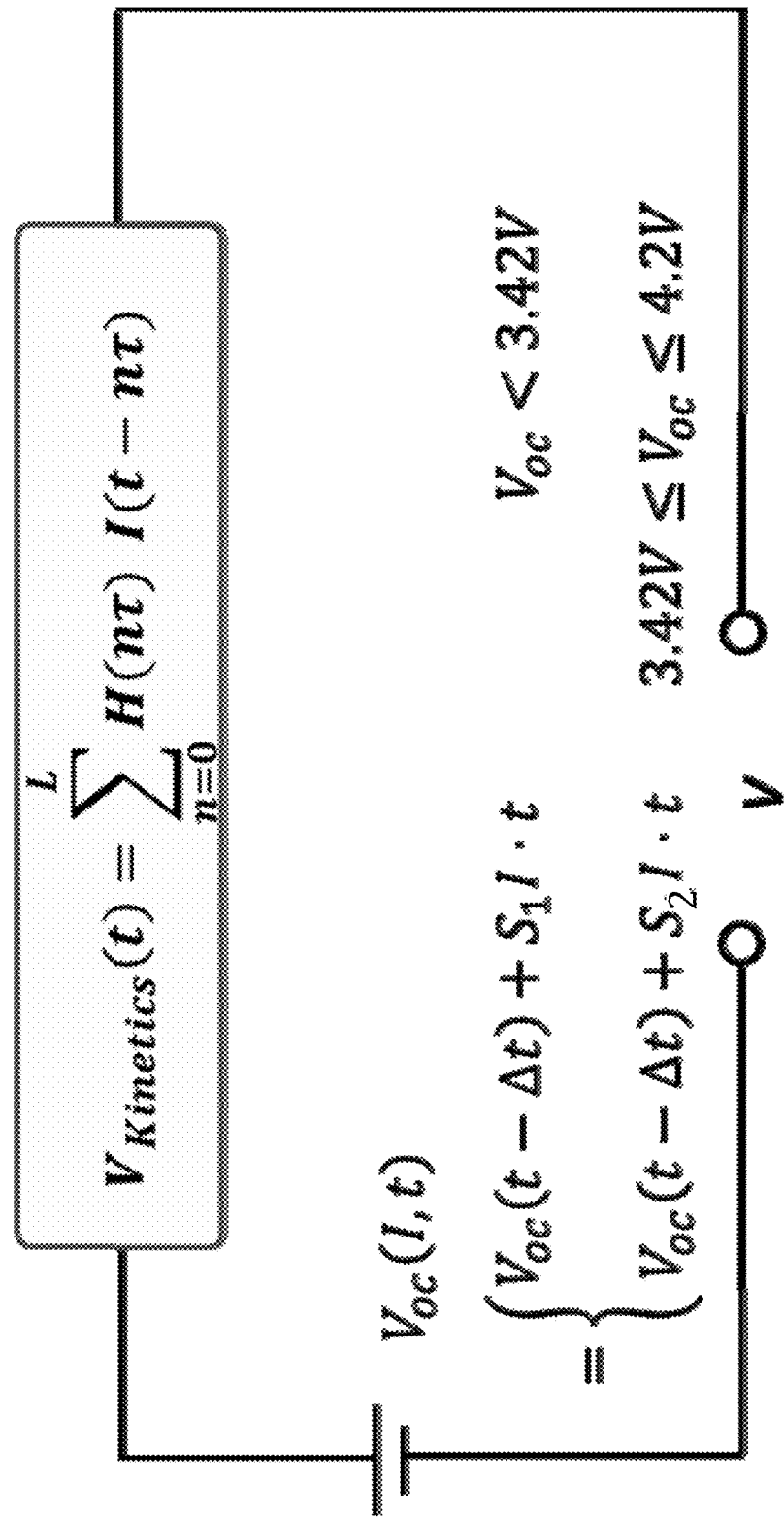
FIG. 2 is a schematic of the battery model for variations of this invention.

In some embodiments, a gradient of open-circuit voltage versus time is first identified. A schematic diagram for simulating a terminal current (I) and voltage (V) relationship of a metal-ion battery is shown in FIG. 2. The schematic is based on an FIR model, and the governing equation of the FIG. 1 schematic is $$V(t) = V_{oc}(I, t) + \sum_{n=0}^{L} H(n\Delta t) I(t - n\Delta t) \qquad \text{EQ. 3}$$

where $\{H(n\Delta t); n=0, 1, \ldots, L\}$ are the coefficients of the FIR filter, H is the impulse response at each sampling time, and $\Delta t$ is the sampling period. The open-circuit voltage $V_{oc}$ is a function of currents and times, noting that FIG. 1 shows a specific example of an approximated function, as will be explained below. The second term of EQ. 3 is the kinetic voltage $V_{kinetics}(t)$ shown in the upper portion of FIG. 2.

The open-circuit voltage is given by $$V_{oc}(I,t) = V_{oc}(t-\Delta t) + SI \cdot t \qquad \text{EQ. 4}$$

For most batteries, this function can be estimated from a measured $V_{oc}$/SOC relationship. This relationship may be determined from thermodynamic properties of the battery and is assumed to be constant during the test. Voltage contributions due to hysteresis effects are not considered in formulizing $V_{oc}$ and are typically minimal for lithium-ion batteries. When hysteresis effects are substantial, a hysteresis voltage term can be included, as described in Verbrugge et al., *J. Electrochemical Society*, 152, A333 (2005), which is hereby incorporated by reference herein.

Figure 6:
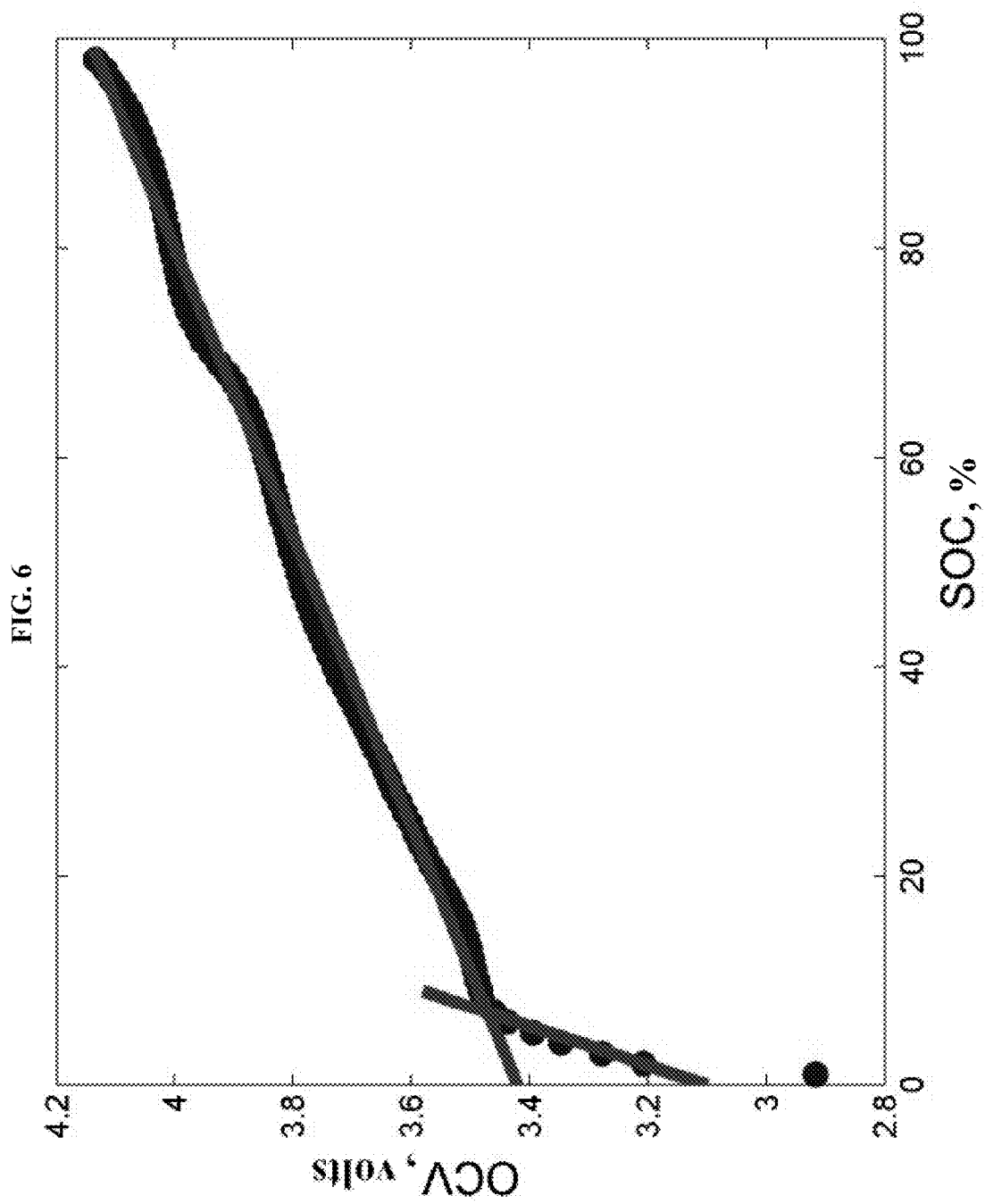
FIG. 6 is a graph of measured $V_{oc}$/SOC data (dots) and an approximated function of $V_{oc}$ versus SOC (lines) in two different regions.

Based on the assumption of no voltage hysteresis effects, embodiments of the invention build up the function of $V_{oc}(I,t)$ by curve-fitting measured $V_{oc}$/SOC data. For illustration purposes, FIG. 6 shows experimental data of $V_{oc}$ versus SOC obtained for a single cell (LiNCM, Sanyo) tested in the Examples herein. Two segments of straight lines are used to approximate experimental data. In FIG. 2, the formula for $V_{oc}(I,t)$ includes two parameters, $S_1$ and $S_2$, corresponding to the first (left side of plot) and second straight lines, respectively. Different batteries may certainly have a different $V_{oc}$ marking between one straight line approximation and another. Also, more than two straight-line segments may be used for increased model fidelity. In some embodiments, the $V_{oc}$/SOC data may be curve-fit to generate the function of $V_{oc}(I,t)$ using a different number of adjustable parameters.

Without implying a limitation, in the range of $V_{oc} < 3.42$ V, $dV_{oc}/dSOC \approx 0.05$ V/%, and for the range of $3.42 \leq V_{oc} \leq 4.2$ V, $dV_{oc}/dSOC \approx 0.0074$ V/%. Since $dSOC = Idt/Q_0 \cdot 100$ where $Q_0$ is the cell capacity which in this illustration is about 1.5 Ah, then $S_1 = 9.2 \times 10^{-4}$ and $S_2 = 1.4 \times 10^{-4}$. The gradient of open-circuit voltage vs. time is thus obtained from measured $V_{oc}$/SOC data. With the example for the test cell, $$\frac{dV_{oc}}{dt} = S_1 I(t), \ V_{oc} < 3.42 \ V \qquad \text{EQ. 5A}$$

$$\frac{dV_{oc}}{dt} = S_2 I(t), \ 3.42 \ V \leq V_{oc} \qquad \text{EQ. 5B}$$

Some embodiments recursively regress $V_{oc}$ and FIR model parameters $\{H(n\Delta t); n=0, 1, \ldots, L\}$ in real time, as follows, applying the extended Kalman filtering technique. First, some embodiments group $V_{oc}$ together with FIR parameters as the state vector of the dynamic system, as in $$x(t) = [V_{oc}, H_0, H_1, H_2, \ldots, H_{L-1}] \qquad \text{EQ. 6}$$

The propagation of the state and its uncertainty in a discrete-time system can be modeled deterministically as $$\hat{x}_k = \Phi_{k-1}\hat{x}_{k-1} + w \qquad \text{EQ. 7}$$

where the subscript k refers to the moment $t=t_k$, the hat over the symbol implies that it is an estimated value, $\Phi$ is the propagation matrix, and w is the white noise with mean E of w, E(w)=0, and variance of w, $E(ww^T)=Q$. The first element of the state vector, $V_{oc}$, propagates in time governed by EQ. 4, while the other elements are the same. Therefore the propagation matrix is $$\Phi_k = \begin{bmatrix} \frac{dV_{oc}}{dt} & 0 & \cdots & 0 \\ 0 & 1 & 0 & 0 \\ \vdots & 0 & \ddots & \vdots \\ 0 & 0 & \cdots & 1 \end{bmatrix} \Delta t \qquad \text{EQ. 8}$$

The covariance of the state vector, defined as $P = E((x-E(x))(x-E(x))^T)$, is updated as $$\hat{P}_k = \Phi_k \tilde{P}_k \Phi_k^T + Q_k \qquad \text{EQ. 9}$$

where $\tilde{P}_k$ is the previous estimate and $\hat{P}_k$ is the new estimate of the covariance. The estimate of terminal voltage based on the states of the system is $$\hat{V}_k = M^T \hat{x}_k + e_k \qquad \text{EQ. 10}$$

where $e_k$ is the measurement white noise satisfying $E(e_k)=0$, and $E(e_k e_k^T) = R$ which is the covariance matrix. M is a column vector of parameters, $M = [1, I_k, I_{k-1}, \ldots, I_{k-L+1}]$.

By the principle of the extended Kalman filter, the optimized estimation of the state vector $x_k$ is given by $$x_k = \hat{x}_k + K(V_k - \hat{V}_k) \qquad \text{EQ. 11}$$

$$P_k = \hat{P}_k - KM^T\hat{P}_k \qquad \text{EQ. 12}$$

and the Kalman gain K is calculated as $$K = \hat{P}_k M (M^T \hat{P}_k M + R)^{-1} \qquad \text{EQ. 13}$$

with the next iteration given by $\tilde{P}_{k+i} = P_k$, and so on.

In summary, the state vector $x(t)$ as shown in EQ. 6 may be recursively regressed following EQS. 9-13. An extended Kalman filter guarantees the regressed results are the best estimates, under the assumptions imposed.

Some embodiments calculate SOC, $SOP_I$, and/or $SOP_V$ based on the values of the updated state vector. From the first element of the state vector x, $V_{oc}$ can be acquired. The SOC value may be obtained from the $V_{oc}$/SOC correlation data, such as in the form of a graph, equation, or look-up table. Such correlation data may take into account Coulomb counting inside the filter during the regression of $V_{oc}$.

For calculating $SOP_I$, the battery voltage response is predicted after the onset of the constant-current demand. Assuming the onset instant is $t=0$, then $V(t)$ ($t>0$) can be forecast with the newly updated parameters $V_{oc}$ and $H(n\Delta t)$:

$$V(t) = V_{oc} + \sum_{n=0}^{L} H_n I(t - n\Delta t) \qquad \text{EQ. 14}$$

In EQ. 14, the currents values before $t=0$ are the preceding measured values, while the current values after $t=0$ are constant and equal to $I_{max}$.

For calculating $SOP_V$, the battery current is predicted after the onset of the ceiling voltage (maximum charge) and the floor voltage (maximum discharge). Assuming again the onset instant is $t=0$, then $I(t)$ for $t>0$ can be forecast with the newly updated parameters $V_{oc}$ and $H(n\Delta t)$:

$$I(t) = \frac{V(t) - V_{oc} - \sum_{n=1}^{L} H_n I(t - n\Delta t)}{H_0} \qquad \text{EQ. 15}$$

In EQ. 15, the current and voltage values before $t=0$ are the preceding measured values, and the voltage values after $t=0$ equal $V_{limit}$, which represents the maximum (charge) or minimum (discharge) value, such as that allowed by the battery manufacturer or the traction system, for example. The current values for $t>0$ can be predicted by recursively utilizing the calculated current value from preceding instant.

Some variations of the present invention are premised on the utilization of a double-pulse battery driving profile for on-line diagnostics of a battery. An exemplary driving profile includes a three-part sequence containing a constant-current discharge pulse, a constant-current charge pulse, and a zero-current period. This sequence may be repeated multiple times to produce the driving profile.

In the case of a lithium-ion battery, for example, the double-pulse driving profile may be tuned to diagnose characteristics of the battery. The pulse width may be tuned so as to characterize the main response time of the battery, and the pulse amplitude may be tuned to excite the diffusion response of the Li-ion in the solid phase of the electrodes. With an impulse-response model as described herein, the kinetic response of the battery can be deduced, covering the entire bandwidth of the impedance characterization spectrum of the battery (or other electrochemical system).

In some embodiments, the discharge pulse is a constant-current discharge pulse and the charge pulse is a constant-current charge pulse. There will generally be a zero-current period between the discharge and charge pulses. That period may be constant or varying. In some embodiments, each of the double-pulse sequences comprises a first zero-current period between the discharge pulse and the charge pulse, and a second zero-current period after the charge pulse and before the next discharge pulse. The first zero-current period and second zero-current period may be the same or different, and again, each of them may be constant or varying.

The magnitude of the constant-current discharge pulse is preferably the same as the magnitude of the constant-current charge pulse, so that integration of current over time is zero. When the integration of current over time is zero, the capacity of the battery is intact during the diagnosis. The double pulse is preferably symmetric (i.e. charge and discharge pulses being symmetric to each other, with opposite signs of the magnitude) so that the battery SOC is maintained while additional double pulses can be applied to the system. Additionally, since the kinetics are SOC-dependent, a symmetric double pulse enables more-accurate characterization at constant SOC.

It should be recognized however that the discharge pulse and charge pulse might not be strictly identical in magnitude, without departing from the spirit of the invention. In certain embodiments, the magnitude of the constant-current discharge pulse is not the same as the magnitude of the constant-current charge pulse.

In other embodiments, the discharge pulse is a varying-current discharge pulse and the charge pulse is a varying-current charge pulse. In some embodiments, the discharge pulse is a constant-current discharge pulse while the charge pulse is a varying-current charge pulse; and in other embodiments, the discharge pulse is a varying-current discharge pulse while the charge pulse is a constant-current charge pulse. In any of these embodiments, it is preferred that the average magnitude of the constant-current discharge pulse is the same as the average magnitude of the constant-current charge pulse, so that integration of current over time remains zero over some period of time.

The plurality of double-pulse sequences includes at least 2 double-pulse sequences, such as 3, 4, 5, 6, 7, 8, 9, 10, 11, 12, 13, 14, 15, 16, 17, 18, 19, 20 or more double-pulse sequences. In certain embodiments of the invention, one double-pulse sequence is employed. Typically, at least two double-pulse sequences will be employed for better accuracy.

The pulse width may be tuned to characterize a main response time of the electrochemical system. The pulse amplitude may be tuned to characterize a diffusion response of the electrochemical system. For example, when the electrochemical system is a lithium-ion battery, the pulse amplitude may be tuned to characterize a diffusion response of lithium ions in at least one electrode solid phase (i.e., either the anode or cathode, or another electrode layer or solid phase if present). A sufficiently large magnitude of the pulse is needed only to excite the diffusion response of the $Li^+$ ion.

Some embodiments employ a driving profile as described in U.S. patent application Ser. No. 14/301,334, filed Jun. 11, 2014, for A DOUBLE-PULSE TECHNIQUE FOR ON-LINE DIAGNOSTICS OF ELECTROCHEMICAL SYSTEMS (Wang et al.), which is hereby incorporated by reference herein.

Note that the current data inputs and voltage data inputs are typically, although not necessarily, the same as the inputs requested into the system. In some embodiments, the current and voltage data inputs are as measured. In other embodiments, the current and voltage data inputs that are received are those that are requested into the system (such as via programmable power-supply apparatus). Generally there is not a difference between requested and measured inputs, but there they can differ in principle (e.g., control logic issues or electrical dissipation).

The method further may include the step of calculating the Fourier transform of the impulse response to obtain at least one electrochemical system state. The electrochemical system state may be selected from the group consisting of state-of-health, state-of-charge, state-of-power, high-frequency resistance, charge-transfer resistance, and double-layer capacitance.

In order for the model to be robust against noises and be agile enough for real-time use, a method is employed that calculates or estimates an impulse response. In the method, the impulse response of the system is deduced with the current and voltage samples of a battery in a selected time window. A moving-window technique may be employed to update the method recursively. The sizes of the impulse response and the window can be adjusted to accommodate the bandwidth of the kinetic process of the system. Once the impulse repulse is deduced at real time, states of the electrochemical system can be derived based on the impulse repulse.

In some embodiments, the method implements noise-filtering techniques which enable stable regression in the presence of noise (e.g., due to electro-magnetic interference). Such noise reduction methods also improve the accuracy and reliability of the regressed parameters. Various types of noise in the current and/or voltage data may be present, including high-frequency noise.

In some embodiments, a high-frequency pass filter is used for filtering out static noises associated with current and voltage measurements. A high-frequency pass filter is an electronic filter that passes high-frequency signals but attenuates signals with frequencies lower than the cutoff frequency. High-frequency pass filtering to remove at least some static noises may be helpful in improving the stability of the method.

In some embodiments, a least-squares regression method is implemented for improving the stability of the method against high-frequency noises. Least-squares regression utilizes methods such as, but not limited to, linear least squares, non-linear least squares, partial least squares, sparse partial least squares, weighted least squares, least squares with penalty function, and combinations thereof.

In some embodiments, recursive methods are utilized wherein all information utilized stems from previous time-step calculations and measurements at the present time-steps. Optionally, a moving-window technique may be employed to update the method recursively. The sizes of the impulse response and the window can be adjusted to accommodate the bandwidth of the kinetics of the selected electrochemical system (e.g., a battery or fuel cell).

There are several methods to dictate the adjustment of the size of the sampling window. One method is to adjust the size based on the knowledge of the thermodynamics and kinetics of the electrochemical system. If the system has a more sluggish kinetic response, the window may be increased, and vice versa. The response time is different for different electrochemical systems. Also the response time is generally different for a given system at different times.

Another method to dictate the adjustment of the size of the sampling window is based on mathematics. The size of the window can be increased at first, and the result of the impulse response H(t) can be used to compare with the H(t) with the original window size. If H(t) changes significantly, the sampling window size may be increased. If H(t) does not change significantly, the size of the window may be deemed to be wide enough.

In certain embodiments, additional data inputs (beyond current and voltage) are considered in the model and methods. Additional data inputs may relate to ambient conditions of the local environment, including temperature, pressure, relative humidity, and electromagnetic interference patterns, for instance. Additional data inputs may be based on previous experience with similar devices, or other ways to capture prior knowledge to improve the accuracy of the diagnostics for the intended purpose. These additional data inputs may be quantitative or qualitative in nature.

The above-described methods may be implemented in a suitable physical apparatus. Variations of this invention provide a system for dynamically characterizing the state of charge and state of power a battery (e.g., a lithium-ion battery), the system comprising a battery and a programmable power-supply apparatus electrically linked with the battery, wherein the programmable power-supply apparatus is programmed using non-transitory memory with executable code for executing the steps of:

(a) cycling a battery with a driving profile;

(b) initializing a recursive algorithm that relates battery terminal voltage to battery current, wherein the recursive algorithm includes voltage components of (i) open-circuit voltage and (ii) a finite-impulse-response filter to dynamically model kinetic voltage;

(c) measuring the battery terminal voltage and the battery current at least at a first time and a second time during the cycling;

(d) calculating, using the recursive algorithm, battery open-circuit voltage and finite-impulse-response filter parameters;

(e) calculating battery state of charge based on the open-circuit voltage from step (d), using a look-up table, graph, equation, or combination thereof; and (f) calculating battery state of power based on the open-circuit voltage and the finite-impulse-response filter parameters from step (d).

Figure 3:
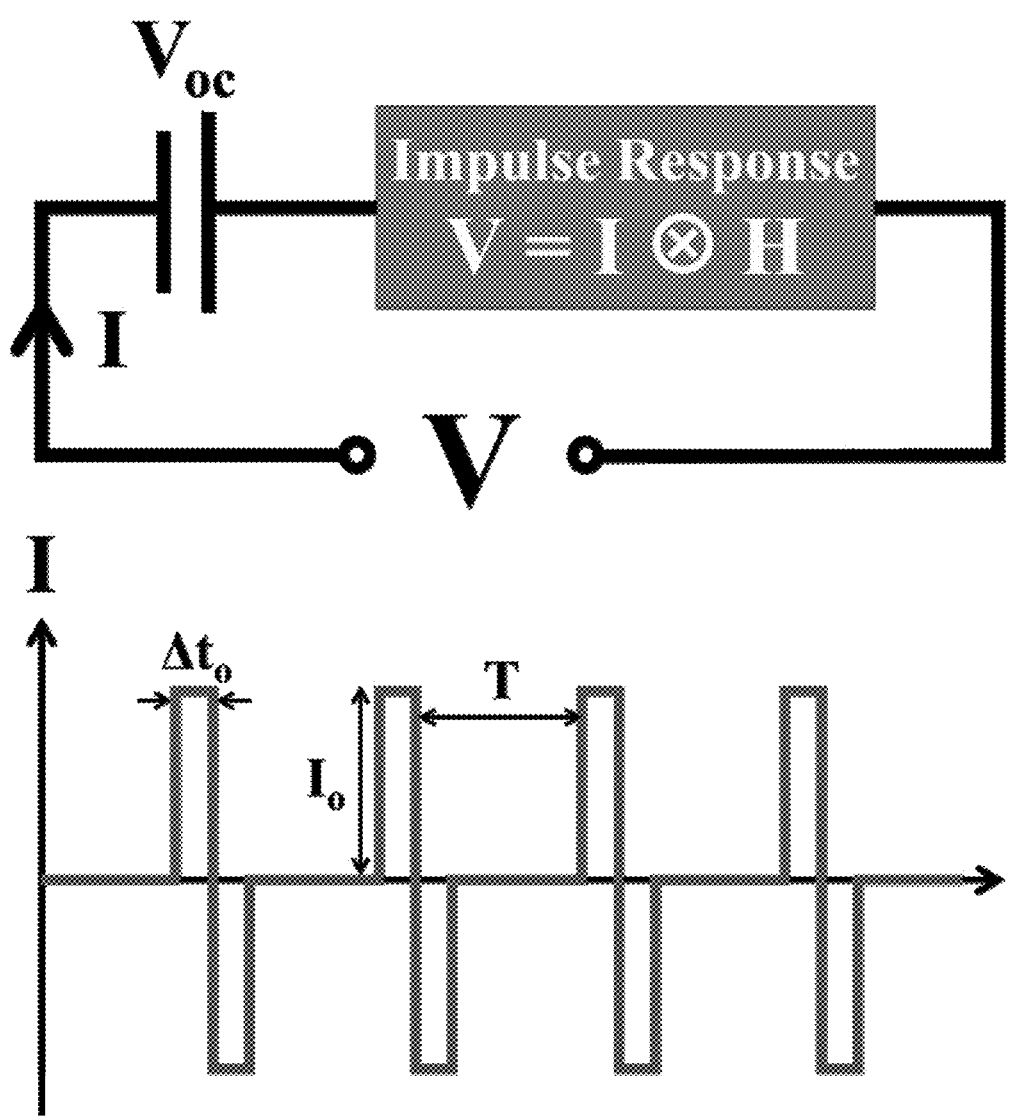
FIG. 3 is a schematic of the impulse-response model and an illustration of an exemplary double-pulse current-input signal, in some variations of the invention.

In certain system embodiments, the driving profile includes a plurality of double-pulse sequences (e.g., lower half of FIG. 3), wherein each of the double-pulse sequences comprises a discharge pulse having a pulse width and a pulse amplitude, a charge pulse having the pulse width and the pulse amplitude, and a zero-current period.

The kinetic voltage may be formulated as the convolution of the finite-impulse-response filter parameters with the battery current.

The finite-impulse-response filter is the only filter in the recursive algorithm, in some system embodiments. The recursive algorithm may utilize an extended Kalman filter, for example.

In some embodiments, the state of power is calculated as a product of a time-varying voltage and a constant current, wherein the constant current is the maximum positive (charging) or negative (discharging) current applicable to the battery. Alternatively, or additionally, the state of power is calculated as a product of a constant voltage and a time-varying current, wherein the constant voltage is the maximum voltage (charging) or minimum voltage (discharging) current applicable to the battery.

The "computer" utilized in the apparatus is any programmable computing device, or plurality of devices which may be distributed in time or space, capable of being programmed or otherwise caused to execute code for executing the steps of any of the methods described herein. Any programming languages or platforms may be employed, such as using C++ or MATLAB®, for example. The method may be embedded within a controller.

A computer may be a programmable power-supply apparatus electrically linkable with an electrochemical device for measurements. In some embodiments, a computer may include a power-supply apparatus as well as a separate computing device or area that is in communication with the power-supply apparatus.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods recited in this description. Optionally, the computer may be configured to exchange data with a network (such as the Internet), and may carry out calculations on remote computers, servers, or via cloud computing.

Figure 4:
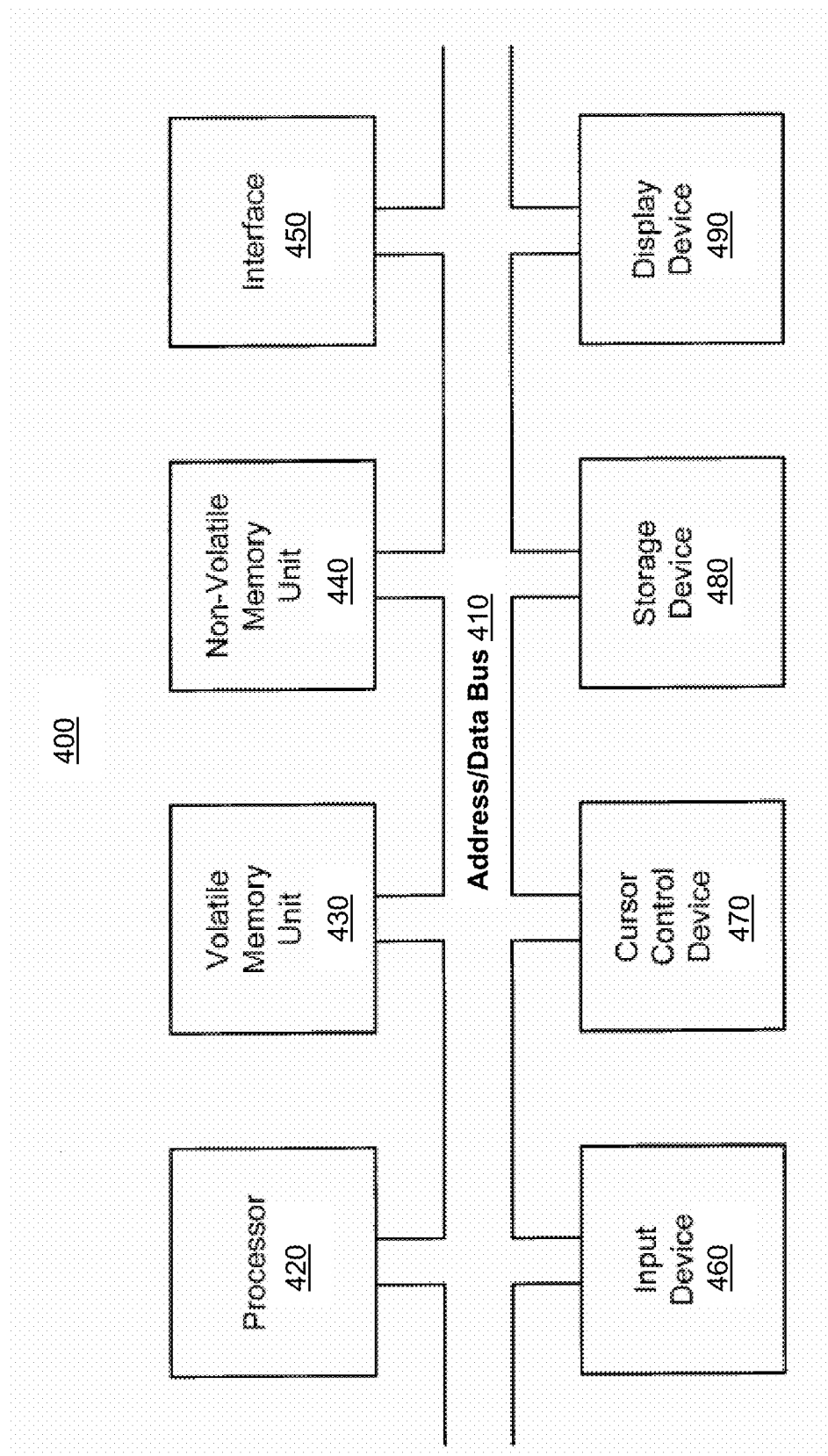
FIG. 4 is a depiction of an exemplary computer system, in accordance with some embodiments of the invention.

An exemplary computer system 400 in accordance with some embodiments is shown in FIG. 4. Exemplary computer system 400 is configured to perform calculations, processes, operations, and/or functions associated with a program or method. In some embodiments, certain processes and steps discussed herein are realized as a series of instructions (e.g., software program) that reside within computer-readable memory units and are executed by one or more processors of exemplary computer system 400. When executed, the instructions cause exemplary computer system 400 to perform specific actions and exhibit specific behavior, such as described herein.

Exemplary computer system 400 may include an address/data bus 410 that is configured to communicate information. Additionally, one or more data processing units, such as processor 420, are coupled with address/data bus 410. Processor 420 is configured to process information and instructions. In some embodiments, processor 420 is a microprocessor. Alternatively, processor 420 may be a different type of processor such as a parallel processor, or a field-programmable gate array.

Exemplary computer system 400 is configured to utilize one or more data-storage units. Exemplary computer system 400 may include a volatile memory unit 430, such as (but not limited to) random access memory ("RAM"), static RAM, or dynamic RAM, coupled with address/data bus 410, wherein volatile memory unit 430 is configured to store information and instructions for processor 420. Exemplary computer system 400 further may include a non-volatile memory unit 440, such as (but not limited to) read-only memory ("ROM"), programmable ROM ("PROM"), erasable programmable ROM ("EPROM"), electrically erasable programmable ROM "EEPROM"), or flash memory coupled with address/data bus 410, wherein non-volatile memory unit 440 is configured to store static information and instructions for processor 420. Alternatively exemplary computer system 400 may execute instructions retrieved from an online data-storage unit such as in "cloud computing."

In some embodiments, exemplary computer system 400 also may include one or more interfaces, such as interface 450, coupled with address/data bus 410. The one or more interfaces are configured to enable exemplary computer system 400 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 400 may include an input device 460 coupled with address/data bus 410, wherein input device 460 is configured to communicate information and command selections to processor 420. In accordance with certain embodiments, input device 460 is an alphanumeric input device, such as a keyboard, that may include alphanumeric and/or function keys. Alternatively, input device 460 may be an input device other than an alphanumeric input device. In some embodiments, exemplar computer system 400 may include a cursor control device 470 coupled with address/data bus 410, wherein cursor control device 470 is configured to communicate user input information and/or command selections to processor 420. A cursor control device 470 may be implemented using a device such as a mouse, a track-ball, a track-pad, an optical tracking device, or a touch screen. A cursor control device 470 may alternatively, or additionally, be directed and/or activated via input from input device 460, such as in response to the use of special keys and key sequence commands associated with input device 460. Alternatively, or additionally, cursor control device 470 may be configured to be directed or guided by voice commands.

In some embodiments, exemplary computer system 400 further may include one or more optional computer-usable data-storage devices, such as storage device 480, coupled with address/data bus 410. Storage device 480 is configured to store information and/or computer-executable instructions. In some embodiments, storage device 480 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 490 is coupled with address/data bus 410, wherein display device 490 is configured to display video and/or graphics. Display device 490 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 400 is presented herein as an exemplary computing environment in accordance with some embodiments. However, exemplary computer system 400 is not strictly limited to being a computer system. For example, exemplary computer system 400 may represent a type of data processing analysis that may be used in accordance with various embodiments described herein. Moreover, other computing systems may also be implemented. Indeed, the spirit and scope of the present embodiments are not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

The present invention, in some variations, also provides a computer-readable medium containing program instructions for characterizing the state of charge and state of power of a battery, wherein execution of the program instructions from non-transitory memory by one or more processors of a computer causes the one or more processors to carry out the steps of:

(a) cycling a battery with a driving profile;

(b) initializing a recursive algorithm that relates battery terminal voltage to battery current, wherein the recursive algorithm includes voltage components of (i) open-circuit voltage and (ii) a finite-impulse-response filter to dynamically model kinetic voltage;

(c) measuring the battery terminal voltage and the battery current at least at a first time and a second time during the cycling;

(d) calculating, using the recursive algorithm, battery open-circuit voltage and finite-impulse-response filter parameters;

(e) optionally adjusting the number of the finite-impulse-response filter parameters to improve stability of the method or to accommodate battery kinetics;

(f) calculating battery state of charge based on the open-circuit voltage from step (d), using a look-up table, graph, equation, or combination thereof; and (g) calculating battery state of power based on the open-circuit voltage and the finite-impulse-response filter parameters from step (d).

Figure 5A:
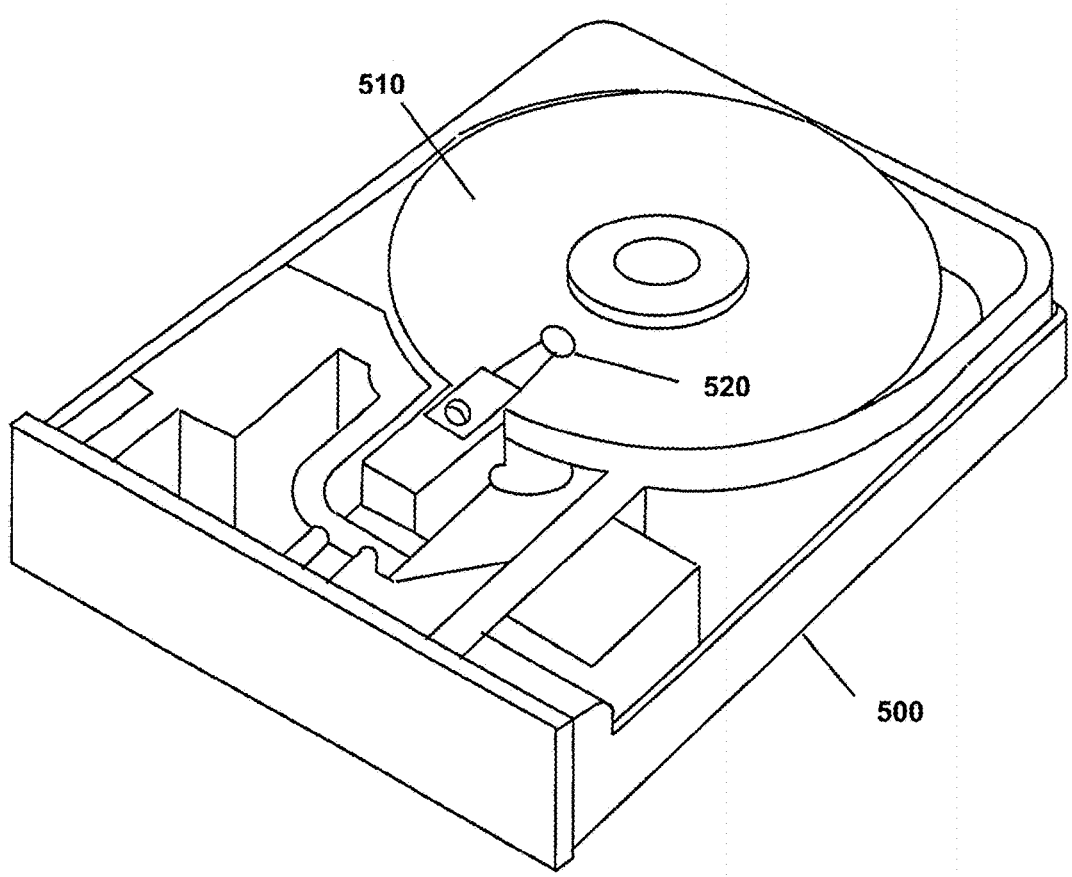
FIG. 5A is an illustration of an exemplary hard disk drive, in some system embodiments.
Figure 5B:
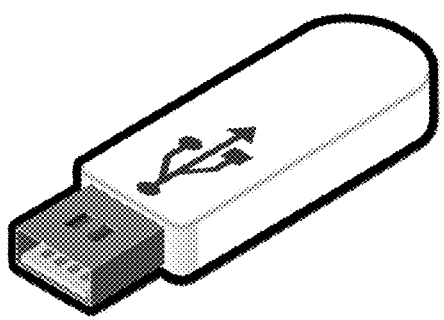
FIG. 5B is an illustration of an exemplary memory stick, in some system embodiments.

The computer-readable medium may be any known medium capable of containing instructions, or computer code, including (but not limited to) hard drives, disks and disk drives, memory sticks, CDs, DVDs, flash memory devices, and so on. The computer-readable medium may be erasable, non-erasable, encrypted-erasable, etc. FIG. 5A shows an exemplary hard disk drive consisting of a housing 500 containing circular platters 510 which can rotate at high speeds past read-write heads 520. The heads 520 write digitized data on thin magnetic coatings. FIG. 5B shows an exemplary memory stick.

EXAMPLES

The battery used in these Examples is a single-cell lithium-ion battery which has a nominal capacity of 5.0 Ah and a voltage range of 2.7 to 4.1 V. A software program coded with MATLAB® is written to carry out calculations. The method is implemented and integrated with a Hardware-in-the-Loop (HWIL) battery testing system. The main facilities include a single-channel tester (BT2000, Arbin Instruments, College Station, Tex., US) that provides up to 5 kW at potentials between 0.6 V and 5 V±1 mV and current ranges up to 1 kA±10 mA, and a thermal control chamber (Test Equity, Moorpark, Calif., US) for accommodating the lithium-ion battery with a programmable range from −40° C. to 130° C. (±10° C.) in a thermal chamber. A PC computer communicates with the tester to initiate the specific driving profiles, and to receive the I-V-T response measured from the battery. The communications between the above-mentioned modules are realized with TCP/IP protocols. The temporal jitter of the recorded data is about a few milliseconds.

The FIR-based model disclosed herein is implemented and integrated with the HWIL system in order to evaluate the on-line capabilities of its SOC and SOP prediction of traction batteries. All results to be discussed in this work were acquired at room temperature. Detailed hardware information can be found in Wang et al., "Battery State Estimator Based on a Finite Impulse Response Filter, *J. Electrochem. Soc.* 2013, 160(11): A1962-A1970, which has been incorporated by reference.

The model is tested by comparing predicted and measured SOC and SOP values with the following automated procedure. An initial SOC value is randomly selected (ranging between 30% to 70%) prior to the start of a drive cycle, and the corresponding open circuit potential $V_{oc}$ is obtained from a look-up table compiled from prior measurements (such as shown in FIG. 6). The battery is charged or discharged with a current rate of C/6 until reaching the value of $V_{oc}$, where it is allowed to rest for 60 minutes (to render an accurate estimation of the initial $V_{oc}$).

The cycling profile is then randomly selected. The cycling process lasts at least 15 minutes, during which the battery voltage and current are sampled every 125±5 ms. The cycling process is stopped at a random time determined during the initial cycling process, and a choice of power test (maximum charge power test, or maximum discharge power test) is randomly selected. The charge or discharge power tests are performed by commanding the maximum or minimum voltage, respectively, from the battery and tracing its current decay as a function of time.

A comparison is then made with $SOP_V$. In these Examples, $SOP_V$ is selected for battery power prediction, as $SOP_I$ is usually more specific to the energy management system. The SOC capability is evaluated by comparing the values of predicted $V_{oc}$ from the FIR model with the values from Coulomb counting. In the lab environment, the Coulomb counting-based $V_{oc}$ prediction is fairly accurate, compared to a real situation with more noise. At the end of the driving profile, the terminal current becomes zero, and the terminal voltage gradually converges to its open-circuit voltage. Depending on the battery, the convergence time can be from seconds to hours. The batteries tested in these Examples converge in a few minutes. The terminal voltage measured with seconds after the driving cycle can be used as the true value.

The initial value of the parameter $V_{oc}$ is set to the measured voltage at the start of the regression. The sampling period is 125 milliseconds, and the number of the FIR parameters is 200. The measurement noise R=0.1 V, and the propagation noise matrix Q=0.

Figure 7:
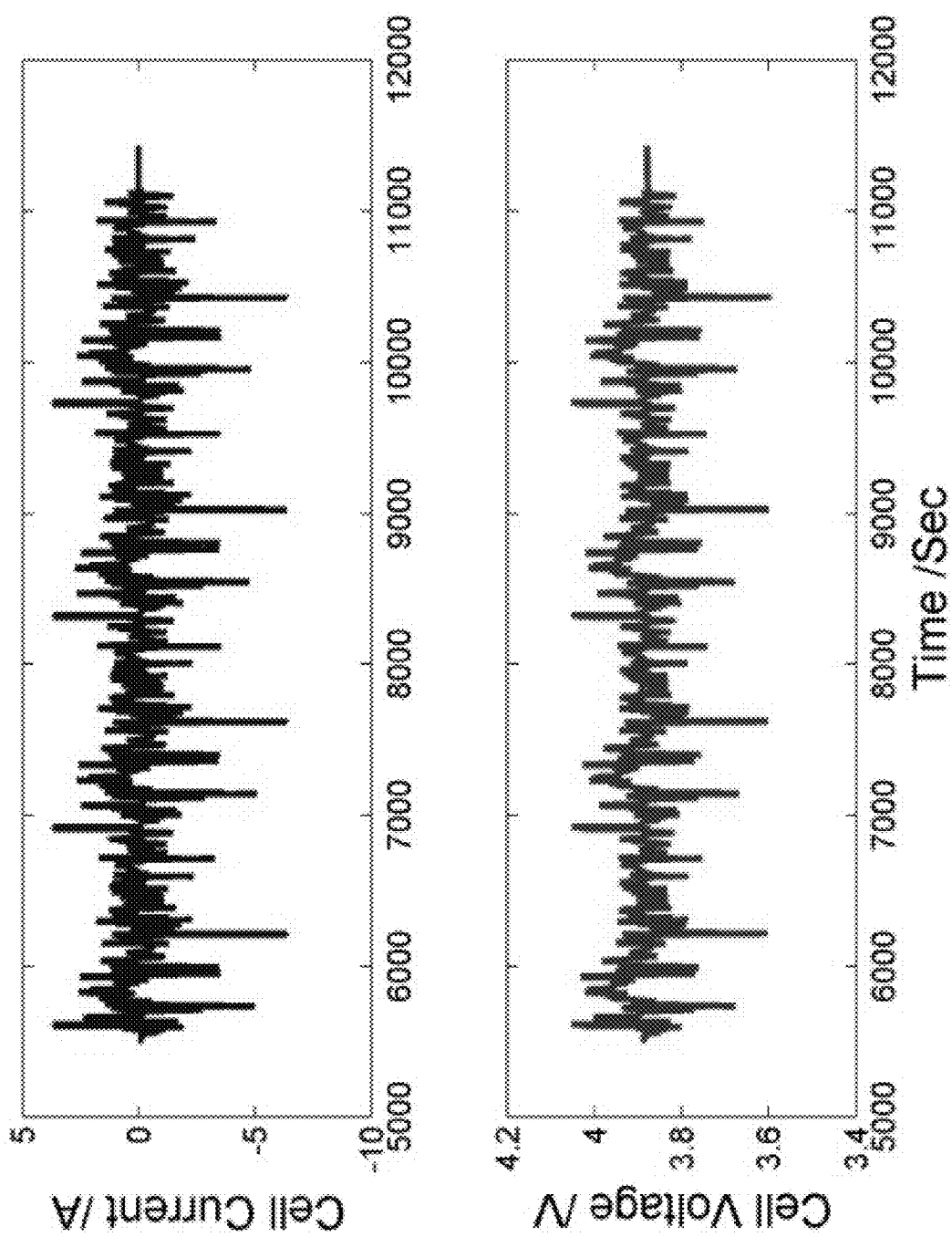
FIG. 7 is a driving profile in some embodiments, including the measured terminal current (top graph) and voltage (lower graph) versus time.

The driving profile is portrayed in FIG. 7 as the measured terminal current and voltage versus time. FIG. 7 shows the measured terminal current (top graph) and voltage (lower graph) signal versus time during one driving test.

Figure 8A:
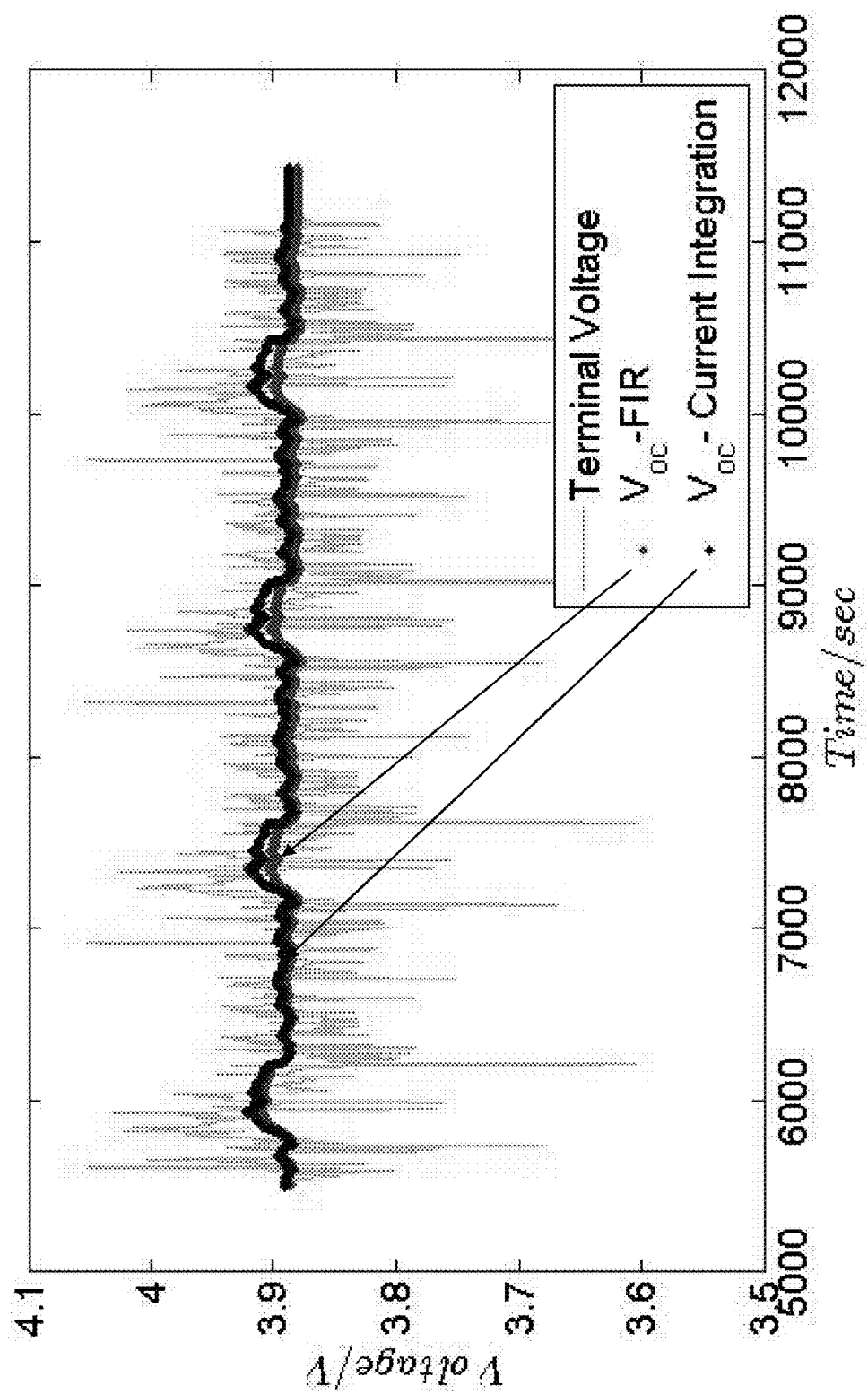
FIG. 8A is a plot of real-time regression of open-circuit voltage based on embodiments of the invention, open-circuit voltage estimation based on Coulomb counting, and the measured terminal voltage.
Figure 8B:
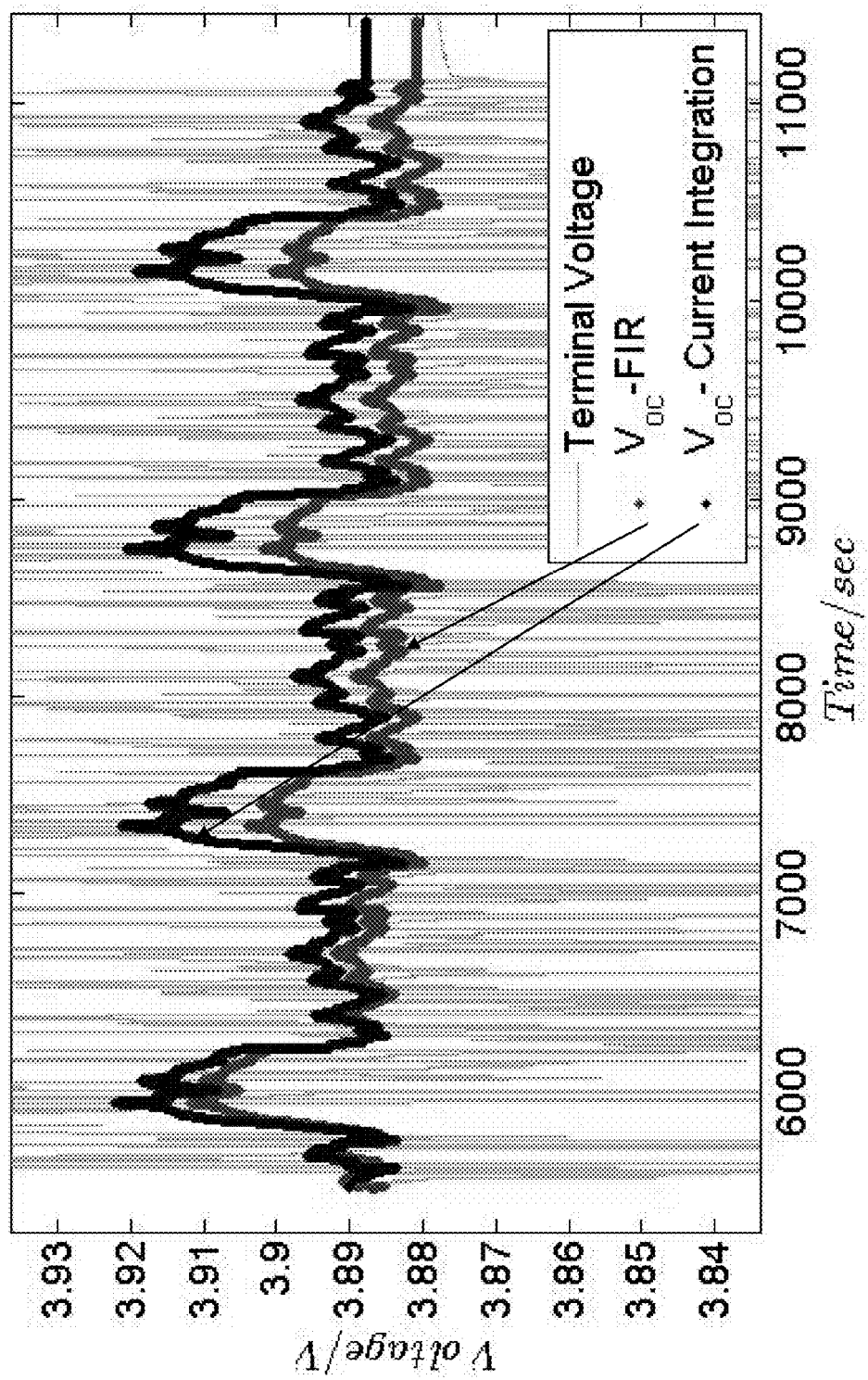
FIG. 8B is a zoomed-in (with respect to voltage) version of FIG. 8A, and is a plot of real-time regression of open-circuit voltage based on embodiments of the invention, open-circuit voltage estimation based on Coulomb counting, and the measured terminal voltage.

The estimation of $V_{oc}$ is portrayed in FIGS. 8A and 8B. The terminal voltage converges to the open-circuit voltage as the battery current becomes zero after the cycle. Therefore, the terminal voltage measured minutes after the cycle can be used as the indicator of the real open-circuit voltage at the end of the cycle. As shown in FIGS. 8A and 8B, $V_{oc}$ based on the model is much closer to the terminal voltage measured a few minutes after the cycle than the values derived from Coulomb counting, indicating its superb accuracy.

Figure 9A:
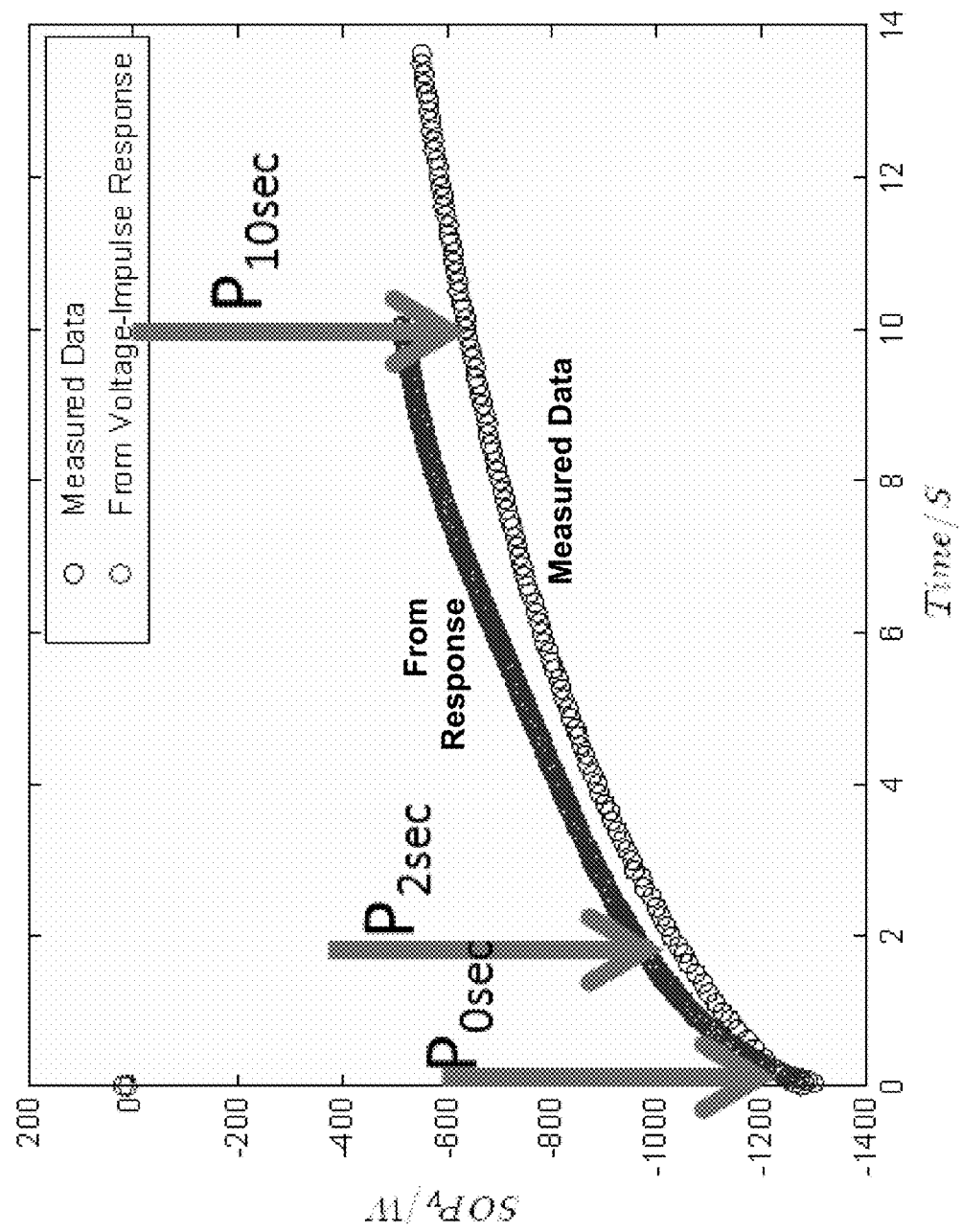
FIG. 9A is a plot of measured and predicted power values as a function of time for a discharge test, in the Examples.
Figure 9B:
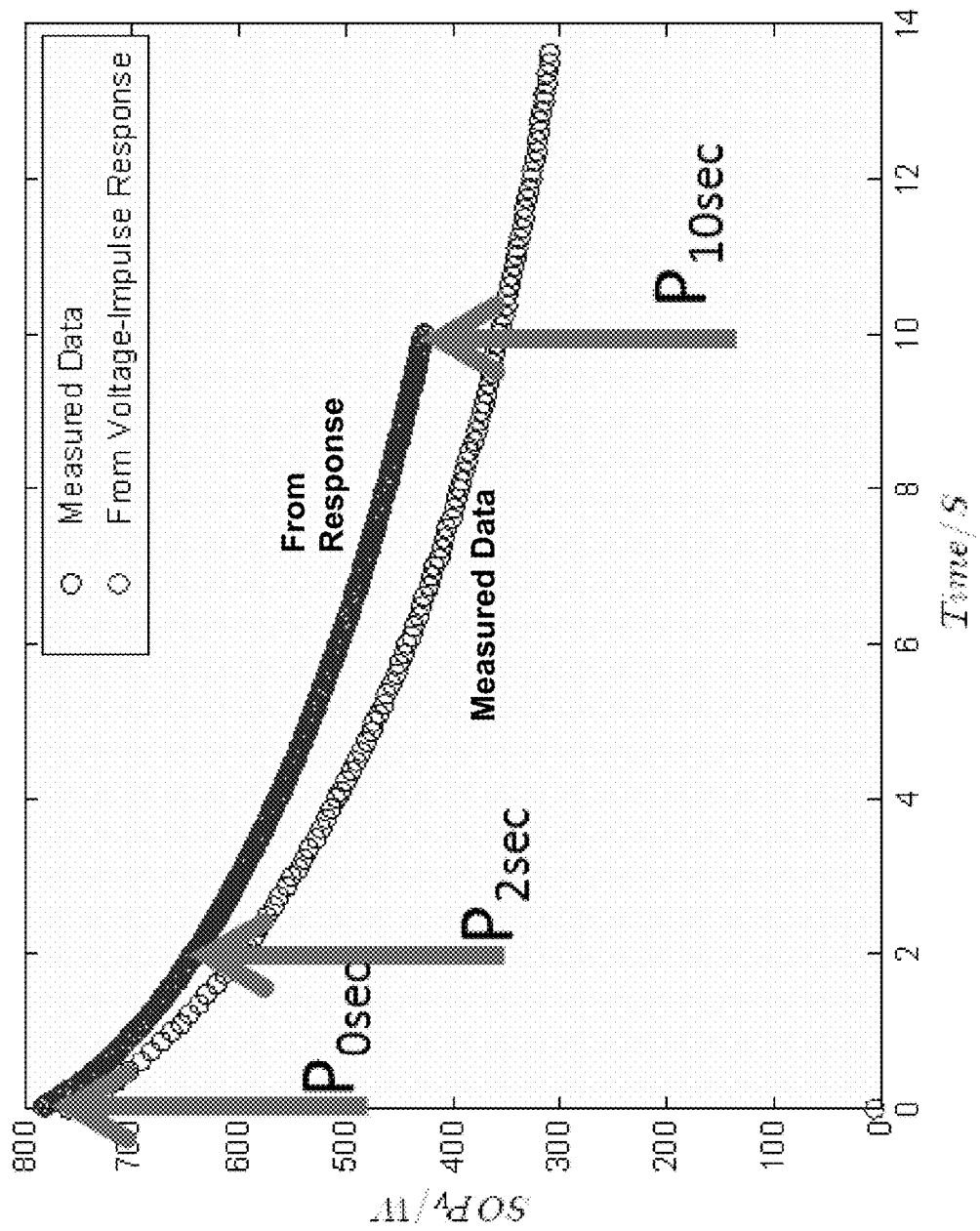
FIG. 9B is a plot of measured and predicted power values as a function of time for a charge test, in the Examples.

Next the SOP forecasting capability is examined. In the measurement of charge, the battery voltage is set to 4.1 volts, and the battery's current, and consequently the power, are then sampled with a 0.1 sec interval and recorded for 10 seconds. The forecast charge powers are calculated based on EQS. 2 and 15. Similar procedures are conducted for the discharge power test, with the battery voltage set to 2.9 volts. The measured and predicted power values as a function of time are shown in FIG. 9A for a discharge test, and FIG. 9B for a charge test. The power values at three instants of time—0 seconds, 2 seconds, and 10 seconds—are recorded after each test for later evaluation. The measured and predicted powers generally exhibit good agreement.

About one hundred random power tests are conducted during various cycle periods. All of the tests are performed with the battery at room temperature. The results are summarized in FIG. 10A. Each data point in the figure corresponds to a random test. Negative powers refer to the discharge power tests. The measured powers are compared to the predicted powers at three given times: 0 seconds, 2 seconds, and 10 seconds. The instantaneous SOP prediction for both charge and discharge power tests is quite accurate. All charge-power projections are accurate with deviations from the measured values being less than 2%. For discharge, the maximum errors range from 5% to 15% for 2 seconds and 10 seconds, respectively. Only one FIR filter is employed to realize both SOC and SOP predictions, resulting in at least a two-fold increased efficiency of computing and storage requirements.

Figure 10A:
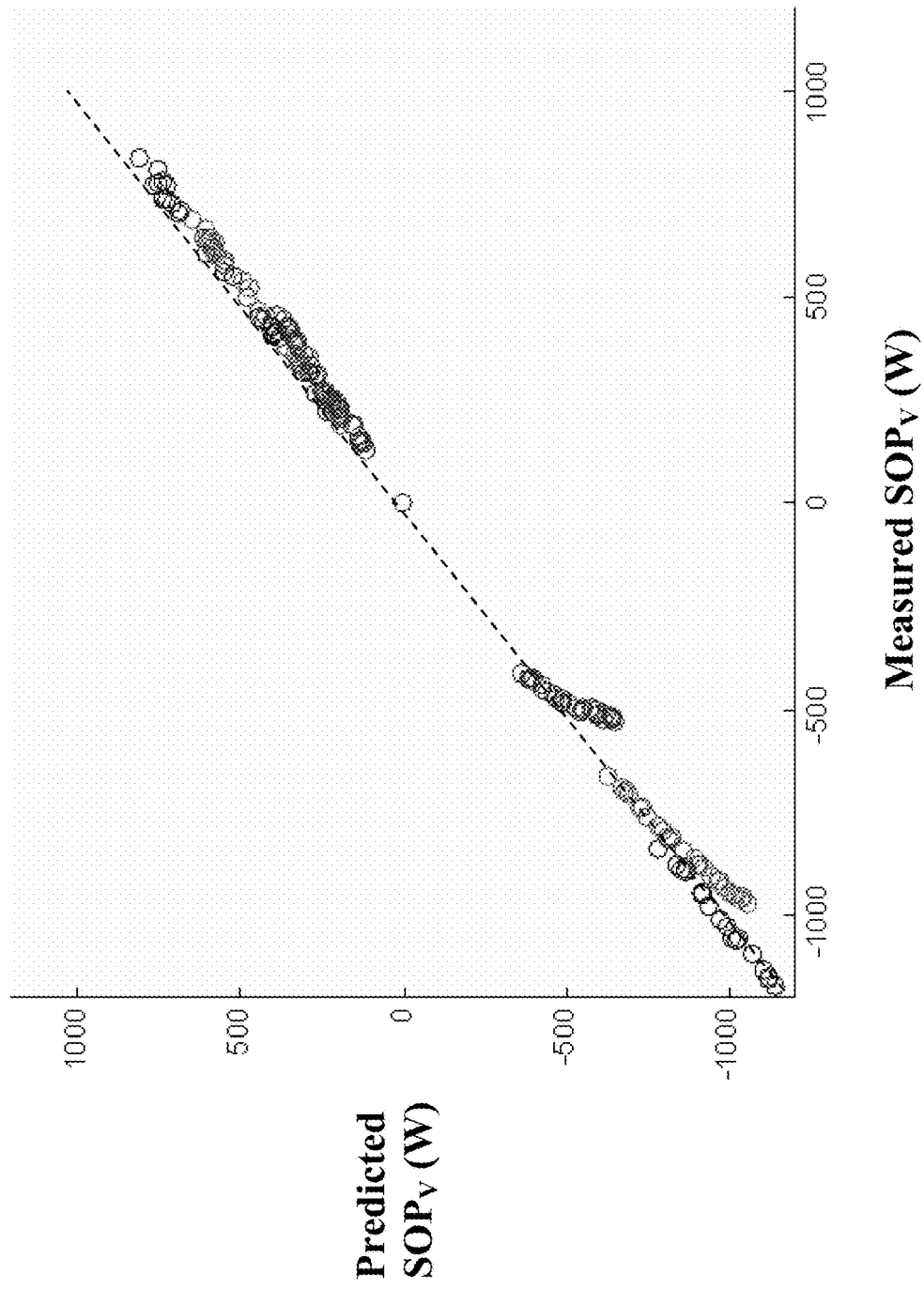
FIG. 10A is a graph summarizing SOP power projections versus measurements using random driving profiles, in the Examples herein.

FIG. 10A shows a summary of random tests for the 0, 2, and 10 second SOP tests. Each circle corresponds to one test. The SOP power projections correspond to the ordinate and the abscissa values reflect measurements. The dotted line is the parity line (measured=predicted). The SOP prediction errors shown in FIG. 10A are mainly due to the limited bandwidth of input data.

Figure 10B:
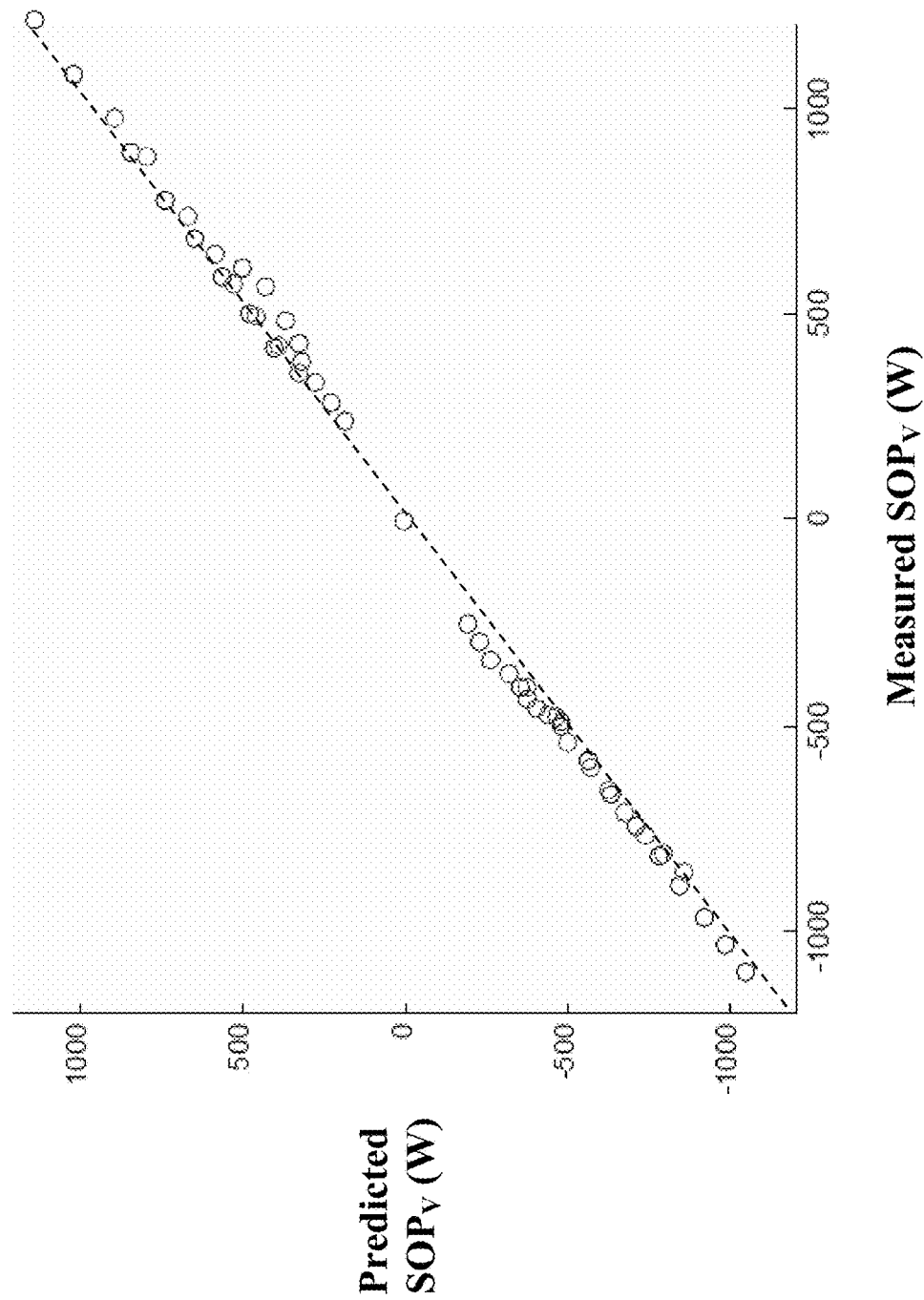
FIG. 10B is a graph summarizing SOP power projections versus measurements using a double-pulse driving profile, in the Examples herein.

Next, the battery is driven with a double-pulse profile as described herein, instead of random profiles. The same test procedures are followed otherwise. FIG. 10B shows a summary of SOP tests with a double-pulse driving profile for the 0, 2, and 10 second SOP tests. Each circle corresponds to one test. The SOP power projections correspond to the ordinate and the abscissa values reflect measurements. The dotted line is the parity line (measured=predicted). FIG. 10B demonstrates a more-accurate SOP prediction, compared to FIG. 10A.

Generally, these Examples demonstrate increased accuracies and reliability of both SOP and SOC accuracies, due to the extended Kalman filtering implementation.

There are a wide variety of practical and commercial uses for the present invention. Applications of the methods in diagnosing electrochemical systems include, but are not limited to, battery diagnostics for in-flight batteries on satellites, aircraft, or other aviation vehicles; real-time management of traction batteries for electric vehicles or hybrid-electric vehicles; and battery-pack management for soldier power and ground vehicles, to name a few.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method for real-time estimation of state of charge and state of power of a battery, said method comprising:
   (a) cycling a battery with a driving profile;
   (b) initializing a recursive algorithm that relates battery terminal voltage to battery current, wherein said recursive algorithm includes voltage components of (i) open-circuit voltage and (ii) a finite-impulse-response filter to dynamically model kinetic voltage;
   (c) measuring said battery terminal voltage and said battery current at least at a first time and a second time during said cycling;
   (d) calculating, using said recursive algorithm, battery open-circuit voltage and finite-impulse-response filter parameters;
   (e) calculating battery state of charge based on said open-circuit voltage from step (d), using a look-up table, graph, equation, or combination thereof;
   (f) calculating battery state of power based on said open-circuit voltage and said finite-impulse-response filter parameters from step (d); and
   (g) managing said battery by adjusting electrical current and/or voltage from or to said battery in response to said battery state of charge and said battery state of power, to dynamically regulate said battery.

2. The method of claim 1, wherein said driving profile includes a plurality of double-pulse sequences, wherein each of said double-pulse sequences comprises a discharge pulse having a pulse width and a pulse amplitude, a charge pulse having said pulse width and said pulse amplitude, and a zero-current period.

3. The method of claim 1, wherein said cycling in step (a) is performed for at least 1 minute.

4. The method of claim 1, wherein said initializing in step (b) uses said battery terminal voltage measured at the beginning of said cycling.

5. The method of claim 1, wherein said kinetic voltage is formulated as the convolution of said finite-impulse-response filter parameters with said battery current.

6. The method of claim 1, said method comprising adjusting the number of said finite-impulse-response filter parameters to improve stability of said method or to accommodate battery kinetics.

7. The method of claim 1, wherein said recursive algorithm utilizes an extended Kalman filter.

8. The method of claim 7, wherein said extended Kalman filter is the only filter in said recursive algorithm.

9. The method of claim 1, said method further comprising generating said look-up table, graph, equation, or combination thereof to form a pre-determined correlation of said open-circuit voltage with said battery state of charge.

10. The method of claim 1, wherein said state of power is calculated as a product of a time-varying voltage and a constant current.

11. The method of claim 10, wherein said constant current is the maximum positive (charging) or negative (discharging) current applicable to said battery.

12. The method of claim 1, wherein said state of power is calculated as a product of a constant voltage and a time-varying current.

13. The method of claim 12, wherein said constant voltage is the maximum voltage (charging) or minimum voltage (discharging) current applicable to said battery.

14. A system for dynamically characterizing the state of charge and state of power a battery, said system comprising a battery and a programmable power-supply apparatus electrically linked with said battery, wherein said programmable power-supply apparatus is programmed using non-transitory memory with executable code for executing the steps of:
   (a) cycling a battery with a driving profile;
   (b) initializing a recursive algorithm that relates battery terminal voltage to battery current, wherein said recursive algorithm includes voltage components of (i) open-circuit voltage and (ii) a finite-impulse-response filter to dynamically model kinetic voltage;
   (c) measuring said battery terminal voltage and said battery current at least at a first time and a second time during said cycling;
   (d) calculating, using said recursive algorithm, battery open-circuit voltage and finite-impulse-response filter parameters;
   (e) calculating battery state of charge based on said open-circuit voltage from step (d), using a look-up table, graph, equation, or combination thereof;
   (f) calculating battery state of power based on said open-circuit voltage and said finite-impulse-response filter parameters from step (d); and
   (g) managing said battery by adjusting electrical current and/or voltage from or to said battery in response to said battery state of charge and said battery state of power, to dynamically regulate said battery.

15. The system of claim 14, wherein said driving profile includes a plurality of double-pulse sequences, wherein each of said double-pulse sequences comprises a discharge pulse having a pulse width and a pulse amplitude, a charge pulse having said pulse width and said pulse amplitude, and a zero-current period.

16. The system of claim 14, wherein said kinetic voltage is formulated as the convolution of said finite-impulse-response filter parameters with said battery current.

17. The system of claim 15, wherein said recursive algorithm utilizes an extended Kalman filter.

18. The system of claim 14, wherein said state of power is calculated as a product of a time-varying voltage and a constant current, wherein said constant current is the maximum positive (charging) or negative (discharging) current applicable to said battery.

19. The system of claim 14, wherein said state of power is calculated as a product of a constant voltage and a time-varying current, wherein said constant voltage is the maximum voltage (charging) or minimum voltage (discharging) current applicable to said battery.

20. A non-transitory computer-readable medium containing computer instructions stored therein for causing a computer processor to perform steps of:
(a) cycling a battery with a driving profile;
(b) initializing a recursive algorithm that relates battery terminal voltage to battery current, wherein said recursive algorithm includes voltage components of (i) open-circuit voltage and (ii) a finite-impulse-response filter to dynamically model kinetic voltage;
(c) measuring said battery terminal voltage and said battery current at least at a first time and a second time during said cycling;
(d) calculating, using said recursive algorithm, battery open-circuit voltage and finite-impulse-response filter parameters;
(e) optionally adjusting the number of said finite-impulse-response filter parameters to improve stability of said method or to accommodate battery kinetics;
(f) calculating battery state of charge based on said open-circuit voltage from step (d), using a look-up table, graph, equation, or combination thereof;
(g) calculating battery state of power based on said open-circuit voltage and said finite-impulse-response filter parameters from step (d); and
(h) managing said battery by adjusting electrical current and/or voltage from or to said battery in response to said battery state of charge and said battery state of power, to dynamically regulate said battery.

* * * * *